(12) United States Patent
Cho et al.

(10) Patent No.: US 7,835,135 B2
(45) Date of Patent: Nov. 16, 2010

(54) MAGNETIC AND DIELECTRIC COMPOSITE ELECTRONIC DEVICE

(75) Inventors: Kyoung Hwan Cho, Suwon-si (KR); Jung Ik Song, Gunpo-si (KR); Jeong In Choi, Gangbuk-gu (KR)

(73) Assignee: Ceratech Corporation, Gunpo-Si (KR)

( * ) Notice: Subject to any disclaimer, the term of this patent is extended or adjusted under 35 U.S.C. 154(b) by 335 days.

(21) Appl. No.: 12/040,368

(22) Filed: Feb. 29, 2008

(65) Prior Publication Data

US 2009/0097219 A1    Apr. 16, 2009

(30) Foreign Application Priority Data

Oct. 16, 2007    (KR) .................. 10-2007-0104111

(51) Int. Cl.
*H01G 4/06* (2006.01)
(52) U.S. Cl. .............. 361/321.4; 361/301.4; 361/311; 361/313; 361/321.2; 361/321.5
(58) Field of Classification Search .............. 361/321.4, 361/321.1, 321.2, 306.1, 306.2, 306.3, 311–313, 361/321.5; 333/184–185
See application file for complete search history.

(56) References Cited

U.S. PATENT DOCUMENTS

| | | | | |
|---|---|---|---|---|
| 5,825,609 A * | 10/1998 | Andricacos et al. | ...... | 361/321.4 |
| 5,872,696 A * | 2/1999 | Peters et al. | ................ | 361/305 |
| 6,195,248 B1 * | 2/2001 | Kunishi et al. | ............. | 361/305 |
| 6,400,553 B2 * | 6/2002 | Yoshii et al. | ............ | 361/321.2 |
| 7,085,118 B2 * | 8/2006 | Inoue et al. | ................ | 361/119 |
| 7,277,270 B2 * | 10/2007 | Sato et al. | ............... | 361/321.1 |

* cited by examiner

*Primary Examiner*—Nguyen T Ha
(74) *Attorney, Agent, or Firm*—Portland IP Law, LLC (57) ABSTRACT

There is a provided a magnetic and dielectric composite electronic device, comprising: a first region with a plurality of magnetic material sheets being layered; a second region with a plurality of dielectric material sheets being layered; and a third region as a middle layer interposed between the first region and the second region, including a Zn—Ti based material to prevent diffusion of the materials during co-firing of the first region and the second region, and the first region, the second region and the third region are integrally formed in a single body. In accordance with the present invention, the low pass filter including the function of the varistor is realized to obtain the EMI function and the ESD control effect. Furthermore, the one chip electronic device having the composite functions is manufactured by a simple process, and the interdiffusion between the different materials forming the magnetic and the dielectric parts is prevented to secure the durability and electrical characteristics of the product.

19 Claims, 10 Drawing Sheets

MAGNETIC AND DIELECTRIC COMPOSITE ELECTRONIC DEVICE

RELATED APPLICATIONS

The present application claims priority from Korean Patent Application No. 2007-104111, filed Oct. 16, 2007, the contents of which are incorporated herein by reference in their entirety.

FIELD OF THE INVENTION

The present invention relates to a magnetic and dielectric composite electronic device, and more particularly, to a multilayered chip-type electronic device in which a magnetic material functioning as an inductor is formed integrally with a dielectric material functioning as a capacitor and a varistor.

BACKGROUND OF THE INVENTION

A resistor R, a capacitor C and an inductor L, which are used as passive devices in an electronic circuit, may have their respective typical functions and roles but may be combined together, to perform a new circuit function. For example, a capacitor basically interrupts a direct current and allows an alternating current signal to pass but it may form a time constant circuit, a time delay circuit, an RC filter and an LC filter. Further, a capacitor itself may remove a noise. An inductor removes a high frequency noise and performs a function of impedance matching and the like.

Due to its resistance being varied according to an applied voltage, a varistor is widely used as a protection device of protecting important electronic devices and circuits against an over-voltage (a surge voltage) and static electricity. That is, when an over-voltage is applied in both ends of a varistor by the over-voltage or a bolt of lightning, the resistance of the varistor rapidly decreases so that no current flows into another device and the circuit is protected against the over-voltage.

As electronic machines become smaller in size, varistors are developed to be small and arrayed, to protect a chip device for a highly-integrated circuit against static electricity and over-voltages. Further, a varistor may be combined with another device, to perform composite functions. When a varistor is combined with a resistor, an important electronic device or circuit can be efficiently protected against over-voltages. When a varistor is combined with an inductor, noise can be removed, thereby stably securing operation of the electronic device or circuit.

When no over-voltage is applied, a resistor-varistor combination device performs a function of a resistor-capacitor combination device. Further, when no over-voltage is applied, a combination of an inductor and a varistor can realize a nor L-type filter formed of an inductor and a capacitor with an excellent characteristic of removing a high frequency noise.

When an abnormal over-voltage flows into a circuit, the aforementioned resistor-varistor combination device or inductor-varistor combination device immediately realizes the function of the varistor to interrupt the over-voltage as described above. In general, proper combinations of the three typical passive devices, i.e., the resistor, inductor and capacitor, can perform the functions of matching impedance and removing high frequency-low frequency noises or selecting signals of a specific frequency band.

To realize the composite functions, the above-described combination device is connected by a wire and the like after each component is separately mounted onto a printed circuit board and the like. However, since mounting an individual device increases an area for the mounting, it does not meet the requirements for diverse small application machines.

Accordingly, a single device with the composite functions needs to be realized. However, a composite device using a single material is limited in performing various functions. For example, a resistor-capacitor (varistor) filter has been presented as a composite component including the function of an LC filter and the function of the varistor to control ESD. However, this filter has the problems of signals generated by a resistance element, power loss and a complicate manufacturing process.

On the other hand, there is a demand for an inductor-capacitor (varistor) composite component not only to control the ESD but also to remove a noise in broader frequency band. An example of the aforementioned composite component may be realized by combining an inductor of low inductance being below 100 nH and a varistor by the application of a single dielectric material. However, in this case, the noise can be removed only in a high frequency band.

A composite component of a high inductance inductor (below 5 μH) and a varistor can be considered by using a magnetic material and a dielectric material. However, when the magnetic material and the dielectric material are joined together and thermally treated at a high temperature, since interdiffusion is generated between the different materials during a firing process, the composite component has the problems in that electrical characteristics and durability of the final device deteriorate.

Moreover, when multilayered different materials undergo co-firing process, it is difficult to match firing shrinkage between the different materials. Thus, compared to the manufacturing of each component using a single material, it is very difficult to control the conditions of a manufacturing process of the composite device.

Consequently, when a single composite device is manufactured by forming the different materials to be integrally with each other, there are many problems in that it is difficult to secure stabilized characteristics of the device, a yield is not good and a manufacturing cost increases. Therefore, there are many problems to be solved with respect to the reliability of the device and the productivity thereof.

Therefore, the present invention is directed to provide a composite electronic device being made of different materials.

Another object of the present invention is to provide a single composite device with excellent electrical and mechanical characteristics.

Another object of the present invention is to provide a composite device which performs the function of a varistor while provides excellent characteristics of removing a noise in broad frequency band.

The other objects and features of the present invention will be presented in more detail below:

In accordance with an aspect of the present invention, the present invention provides a magnetic and dielectric composite electronic device comprising: a first region where a plurality of magnetic material sheets are layered; a second region where a plurality of dielectric material sheets are layered; and a third region as a middle layer interposed between the first region and the second region, including a Zn—Ti-based material to prevent diffusion of the materials when the first region and the second region undergo co-firing process, and the first region, the second region and the third region are integrally formed in a single body.

The third region may be formed of a single sheet or a composite sheet with a plurality of sheets being layered, and it may include powder of, preferably, ZnO of 0.5~1.0 mol and TiO$_2$ of 0.5~1.0 mol. The third region may further include Bi$_2$O$_3$ of 0.1~0.35 mol, and it may further include NiO being or less than 0.1 mol and/or MnCO$_3$ being or less than 0.1 mol.

The electronic device may be formed in a single chip type by forming one electrode pattern on each of the sheets of the first region formed of the magnetic material and each of the sheets of the second region, or it may be formed in an array-type chip (barrage chip) by forming a plurality of electrode patterns on each of the sheets of the first region formed of the magnetic material and each of the sheets of the second region.

The composite electronic device according to the present invention may be represented by an equivalent circuit in which a varistor and a capacitor are positioned towards an input terminal of the device at one side of one inductor, and another varistor and another capacitor are positioned towards an output terminal of the device at the other side of the inductor, and each varistor and each capacitor are grounded. Further, the composite electronic device may be represented by an equivalent circuit in which one varistor and one capacitor are positioned at one side of one inductor towards either an input terminal or an output terminal of the device, and the varistor and the capacitor are grounded.

In the present invention, the Zn—Ti-based material of the third region may be formed on the whole sheet or it may be formed on parts of the sheet so that the rest may be formed of a dielectric material or a magnetic material.

In accordance with the present invention, there is provided the multilayered chip-type electronic device being compounded of the inductor and the varistor. A function of electromagnetic interference (EMI) is performed and an effect of controlling electrostatic discharge (ESD) is obtained by realizing a low pass filter having a function of the varistor. Furthermore, in accordance with the present invention, the one-chip electronic device, which has the composite functions of the LC filter and the varistor of protecting the ESD, is manufactured by a simple process, and the durability and electrical characteristics of a product is secured by preventing the interdiffusion between the different materials respectively forming the magnetic and the dielectric parts.

DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION

The present invention will now be described more fully hereinafter with reference to the accompanying drawings, in which preferred embodiments of the invention are shown.

The present invention relates to a composite electronic device as a single component which is constituted by integrally forming an inductor and a varistor which are separately mounted onto a printed circuit board and the like, thereby contributing to miniaturization of diverse electronic machines.

In the present invention, when a magnetic material is joined with a dielectric material, a middle layer as a material for enhancing adhesion and preventing diffusion is interposed between the magnetic and dielectric materials, thereby stably securing characteristics of the final component. Further, a firing shrinkage is controlled by selecting carefully elements of the magnetic material and the dielectric material, thereby eliminating mechanical defects.

The magnetic material applied to the present invention may use a ferrite-based material having Fe—Ni—Zn as a main element. The magnetic material can control a necessary inductance by controlling constituent elements and contents. Further, diverse additives (for example, the oxides of such as Bi, Co, Si or Cu) may be added to control adhesion property and firing shrinkage.

The dielectric (varistor) material applied to the present invention may realize a necessary characteristic of varistor by having, for example, ZnO, as a main element and adding diverse additives (for example, the oxides of such as Bi, Sb, Ag, Mn, Co, Zr, Cr or Al). The dielectric material may control the adhesion and the firing shrinkage of a final device.

The material for the middle layer, which prevents the diffusion between various elements and improves the adhesion strength when the magnetic material is joined with the dielectric material, has Zn—Ti as a main element and controls the diffusion between the different materials by adding diverse additives (for example, the oxides of such as Ni, Bi or Mn). The material for the middle layer controls firing shrinkage, thereby improving the adhesion strength between the different materials.

Specifically, the middle layer may be formed of powder including ZnO of 0.5~1.0 mol and TiO$_2$ of 0.5~1.0 mol. A Zn—Ti-based material prevents the diffusion of Fe ions, Ti ions and the like during firing process upon the heterogeneous junction between the magnetic material and the dielectric material. When each of ZnO and TiO$_2$ is or less than 0.5 mol, since an effect of cutting off the Fe ions is low, it is confirmed that the characteristics of the varistor in the composite component deteriorate. To the contrary, when each of ZnO and $TiO_2$ is included in excess of 1 mol, it is confirmed that the characteristics of the varistor deteriorate by the diffusion of the Ti ions.

The middle layer may further include $Bi_2O_3$ of 0.1~0.35 mol, and it may further include NiO being or less than 0.1 mol and/or $MnCO_3$ being or less than 0.1 mol. $Bi_2O_3$ as a sintering additive performs a function of controlling the sintering temperature and the firing shrinkage. NiO produces an insulating effect, and $MnCO_3$ develops effects of preventing magnetization and providing gloss.

In the present invention, the material forming the middle layer may be manufactured in a sheet shape by using composite powder produced by mixing, calcining and pulverizing constituent elements. Further, in the present invention, the material forming the middle layer may be formed in one whole sheet or it may be formed in one sheet, together with the magnetic material or the dielectric material, to improve the mechanical strength in the adhesion of the different materials (between the magnetic material and the dielectric material).

Figure 1:
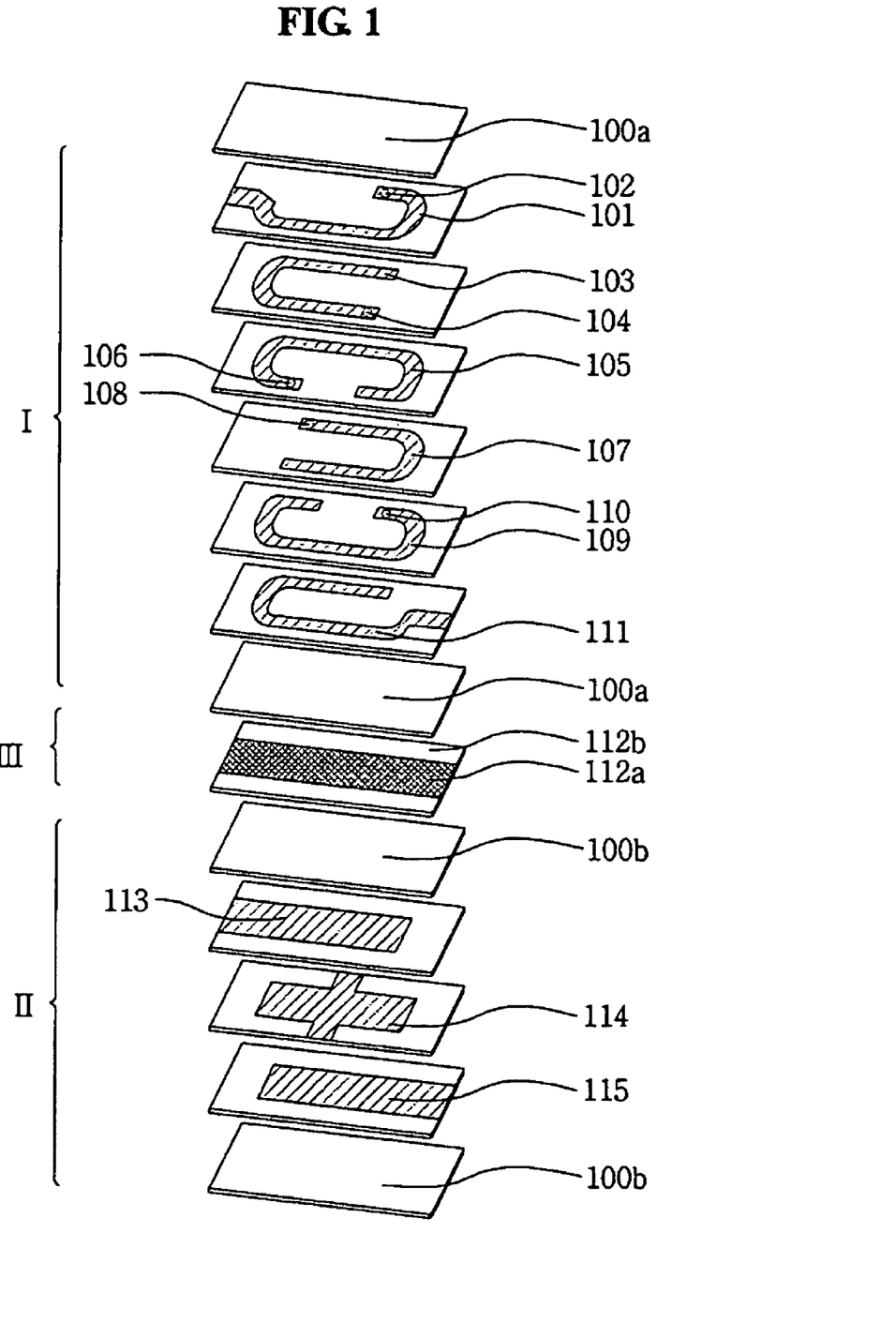
FIG. 1 is an exploded perspective view of an electronic device according to a first embodiment of the present invention.

FIG. 1 is an exploded perspective view of a composite electronic device according to a first embodiment of the present invention. In the composite electronic device, a third region III is interposed as the middle layer between a first region I in which a plurality of magnetic material sheets 100a are layered and a second region II in which a plurality of dielectric material sheets 100b are layered. The first region I corresponds to the inductor and the second region II corresponds to the varistor. The middle layer interposed between the first region I and the second region II includes a Zn—Ti-based material to prevent the diffusion of the materials when the first region I and the second region II undergo co-firing process.

The first region I, the second region II and the third region III are layered to one another, to be integrally formed in a single body, and then, is completed as a chip-type electronic device having an electrode terminal formed on an outer surface as described later.

The first region I includes the plurality of magnetic material sheets 100a formed of the magnetic material. Electrode patterns (inductor patterns) 101, 103, 105, 107, 109 and 111 are respectively formed at least at parts of the plurality of magnetic material sheets 100a. Via-holes 102, 104, 106, 108 and 110 may be respectively formed at one end of each of the electrode patterns 101, 103, 105, 107, 109 and 111.

The second region II includes the plurality of dielectric material sheets 100b formed of the dielectric material. At least two dielectric material sheets in the second region II respectively have electrode patterns 113 and 115, each extended toward only one side end of the dielectric material sheets, and a dielectric material sheet in the second region II has an electrode pattern 114 extended toward two both side ends of the sheet.

The third region III may be formed of a single sheet or a composite sheet with a plurality of sheets being layered. Preferably, the third region III may be formed in a sheet shape, using powder including ZnO of 0.5~1.0 mol and $TiO_2$ of 0.5~1.0 mol. When the first region I formed of the magnetic material and the second region II formed of the dielectric material having the function of the varistor are simultaneously formed, the third region III prevents Fe ions and the like from diffusing, controls firing shrinkage between the different materials, and improves the mechanical characteristics of one composite device being integrally formed.

Figure 2:
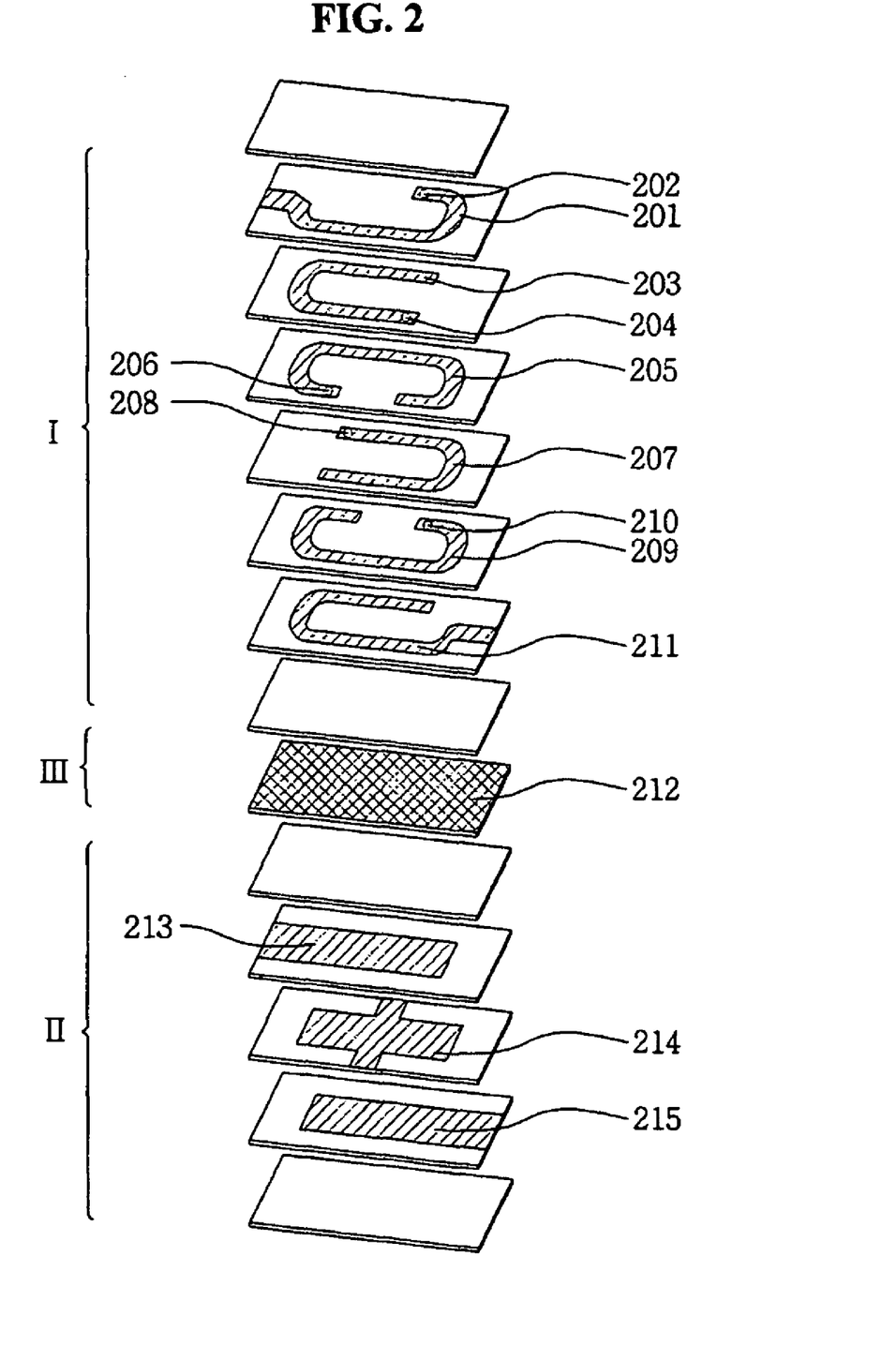
FIG. 2 is an exploded perspective view of an electronic device according to a second embodiment of the present invention.

In FIG. 1, the third region III is formed of the composite sheet including a central part 112a formed of the Zn—Ti-based material and an edge part 112b formed of the magnetic material or the dielectric material. However, in accordance with a second embodiment of FIG. 2, a third region III is formed of a Zn—Ti-based material formed on a whole sheet 212. An area of the middle layer occupied by the Zn—Ti-based material forming the third layer III may vary in consideration of adhesion characteristics of the composite electronic device, any shrinkage during firing process, and the like.

Figure 3:
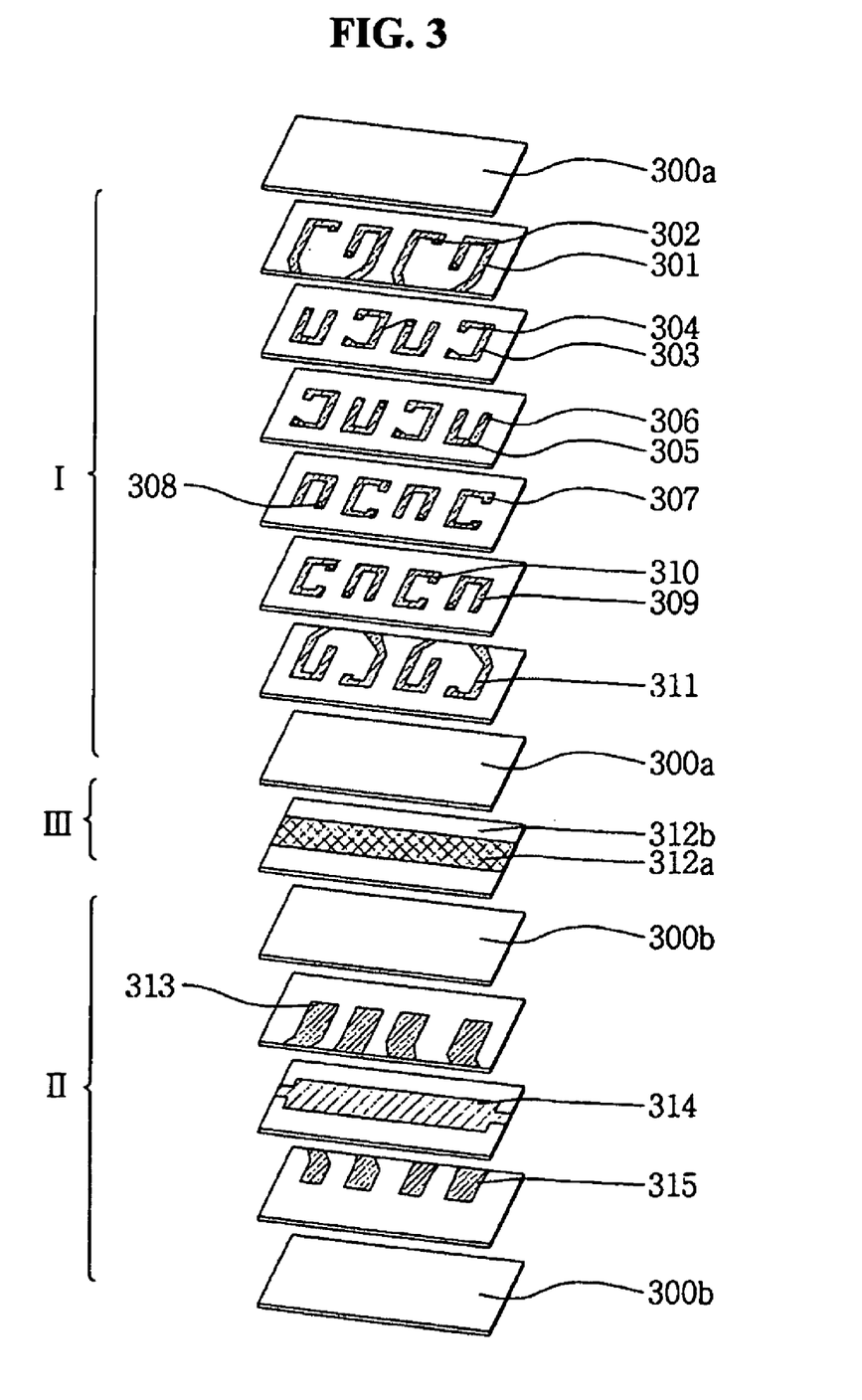
FIG. 3 is an exploded perspective view of an electronic device according to a third embodiment of the present invention.

FIG. 3 is an exploded perspective view of an electronic device according to a third embodiment of the present invention. A third region III is interposed as a middle layer between a first region I in which a plurality of magnetic material sheets 300a are layered and a second region II in which a plurality of dielectric material sheets 300b are layered. The middle layer interposed between the first region I and the second region II includes a Zn—Ti-based material of preventing the diffusion of the materials when the first region I and the second region II are co-fired.

Unlike the foregoing two embodiments, in the first region I of the third embodiment, as shown in FIG. 3, a plurality of respective electrode patterns 301, 303, 305, 307, 309 and 311 are respectively formed to be independent from one another on at least at parts of the plurality of magnetic material sheets 300a formed of the magnetic material. Respective via-holes 302, 304, 306, 308 and 310 are formed at the ends of the respective electrode patterns 301, 303, 305, 307, 309 and 311 as shown.

The second region II includes the plurality of dielectric material sheets 300b formed of the dielectric material. At least two dielectric material sheets in the second region II respectively have a plurality of respective electrode patterns 313 and 315 extended toward only one side end of each of the dielectric material sheets and formed to be independent from one another. A dielectric material sheet in the second region II has an electrode pattern 314 extended to two side ends of the sheet.

The first region I, the second region II and the third region III are layered to one another, to be integrally formed in a single body, thereby realizing an array-type chip component by the plurality of patterns being independently formed at each sheet.

Figure 4:
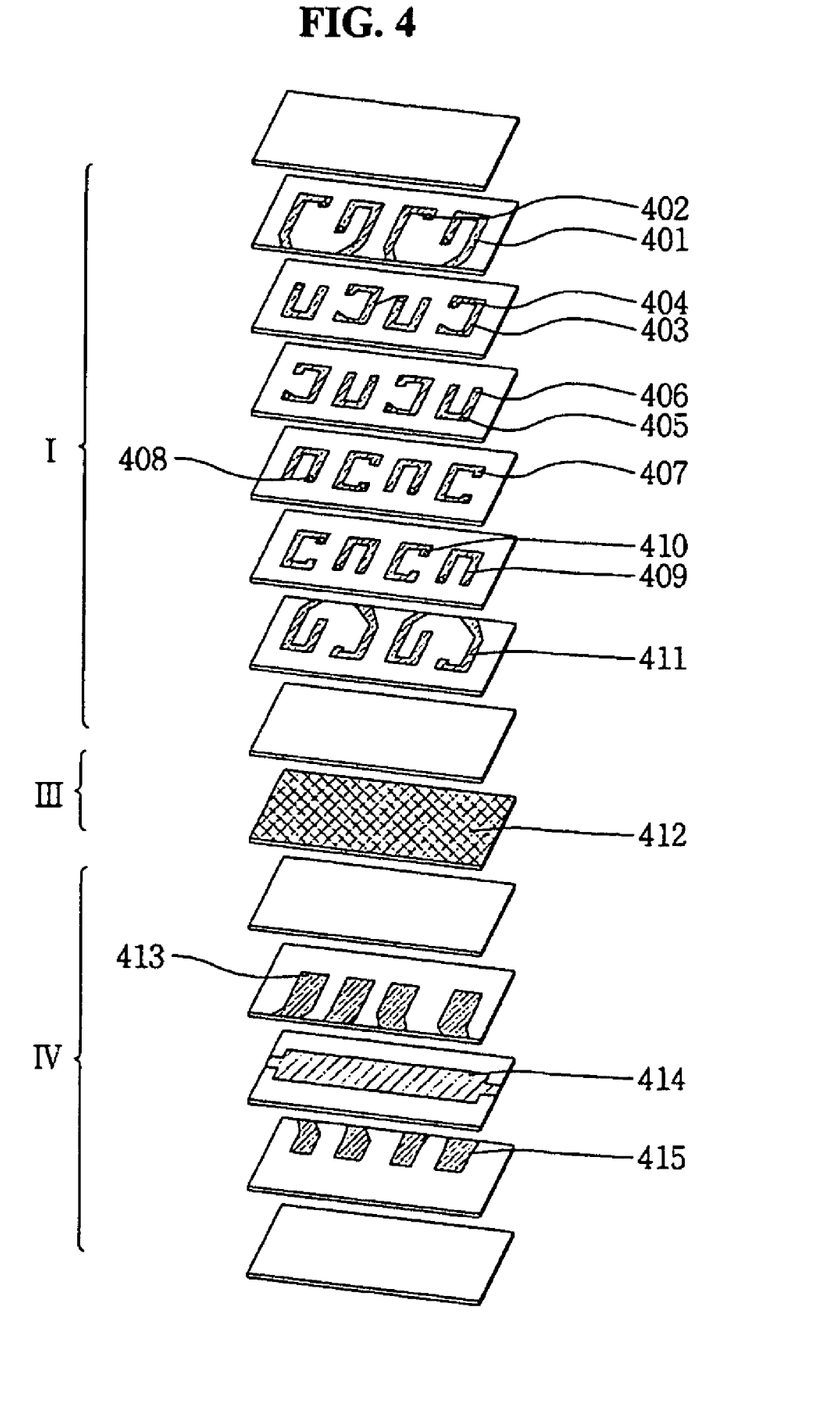
FIG. 4 is an exploded perspective view of an electronic device according to a fourth embodiment of the present invention.

In the third embodiment of FIG. 3 like the first embodiment of FIG. 1, the third region III is formed of the composite sheet including a central part 312a formed of the Zn—Ti-based material and an edge part 312b formed of the magnetic material or the dielectric material. However, in a fourth embodiment of FIG. 4, a third region III is formed of a Zn—Ti-based material 412 formed on a whole sheet 412.

In the present invention, the number of the sheets forming the first, second and third regions, the shape of the electrode patterns and the like may vary, depending on desired characteristics of the electronic devices.

A plurality of sheets according to the above-described embodiments are stacked integrally, and the stacked sheets are co-fired to form a body. Next, electrode terminals are formed at the outer surface of the body, and then the composite electronic device according to the present invention is completed as the chip-type electronic device.

Figure 5A:
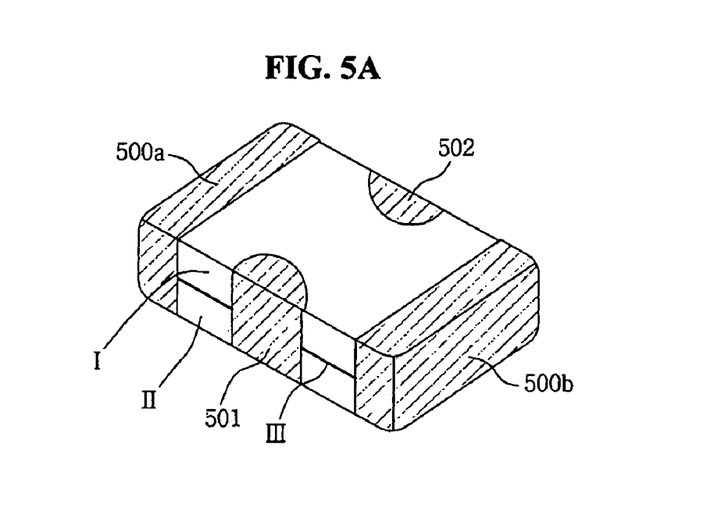
FIG. 5A is a perspective view of the exterior of the electronic device according to the first embodiment or the second embodiment.

FIG. 5A illustrates the exterior of the electronic device according to the first embodiment or the second embodiment. The first region I is combined with the second region II at the boundary of the third region III, to be integrally formed as a single device. A pair of ground electrodes 501 and 502 and a pair of signal electrodes 500a and 500b are formed on the outer surface of the device.

Figure 5B:
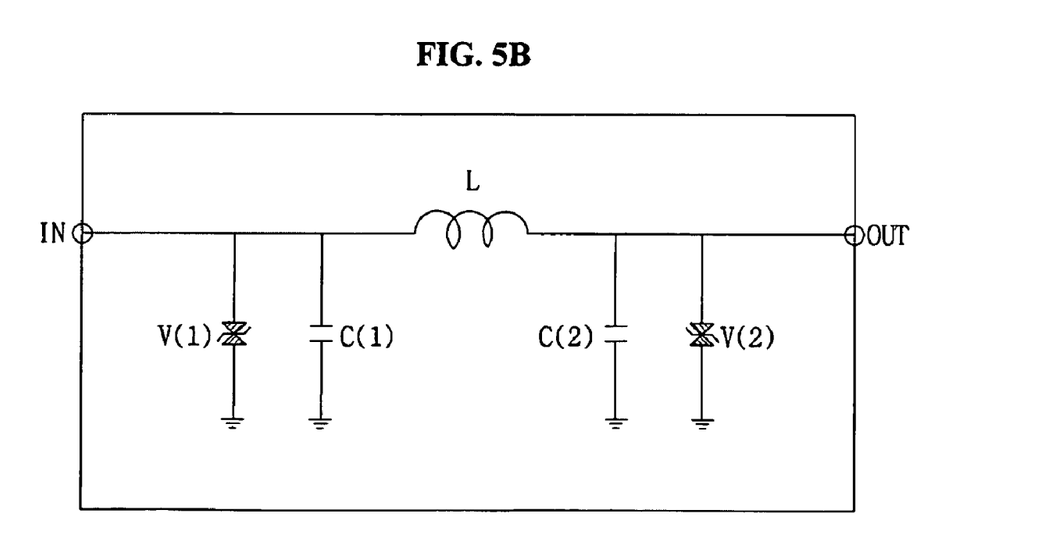
FIGS. 5B and 5C are equivalent circuit diagrams of the electronic device according to the first embodiment or the second embodiment.
Figure 5C:
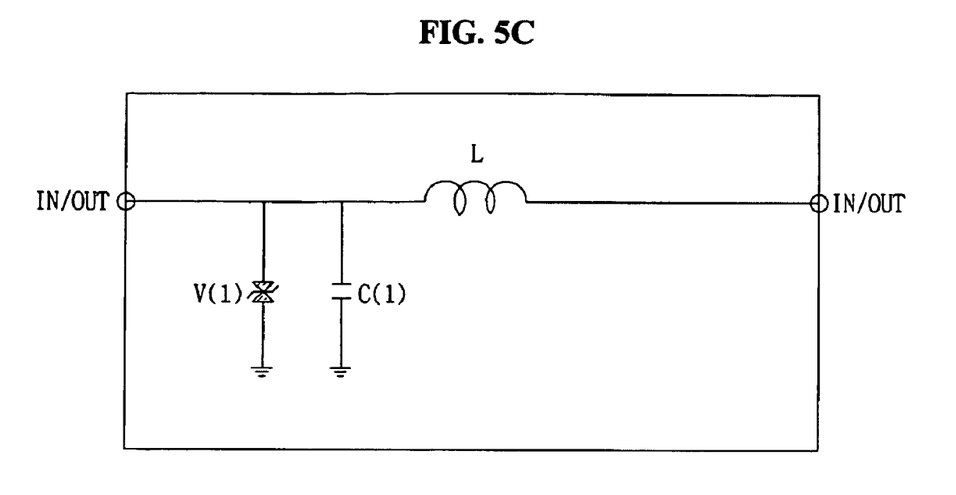

As illustrated in FIG. 5B, the electronic device may be equivalent to a circuit in which one varistor V1 and one capacitor C1 are positioned towards an input terminal at one side of one inductor L and one varistor V2 and one capacitor C2 are positioned towards an output terminal at the other side of the inductor L and in which each varistor and each capacitor are grounded. Further, as illustrated in FIG. 5C, the electronic device may be equivalent to a circuit in which one varistor V1 and one capacitor C1 are positioned at only one side of one inductor L towards, for example, either an input terminal or an output terminal and in which the varistor and the capacitor are grounded.

Figure 6A:
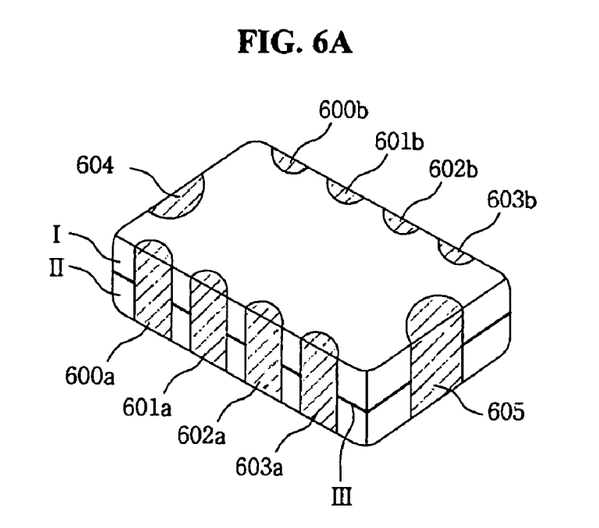
FIG. 6A is a perspective view of the exterior of the electronic device according to the third embodiment or the fourth embodiment.

FIG. 6A illustrates the exterior of the electronic device according to the third embodiment or the fourth embodiment. The first region I is combined with the second region II at the boundary of the third region III, to be integrally formed as a single device. A pair of ground electrodes 604 and 605 and a plurality of signal electrodes 600a, 601a, 602a, 603a, 600b, 601b, 602b and 603b are formed on the outer surface of the device.

Figure 6B:
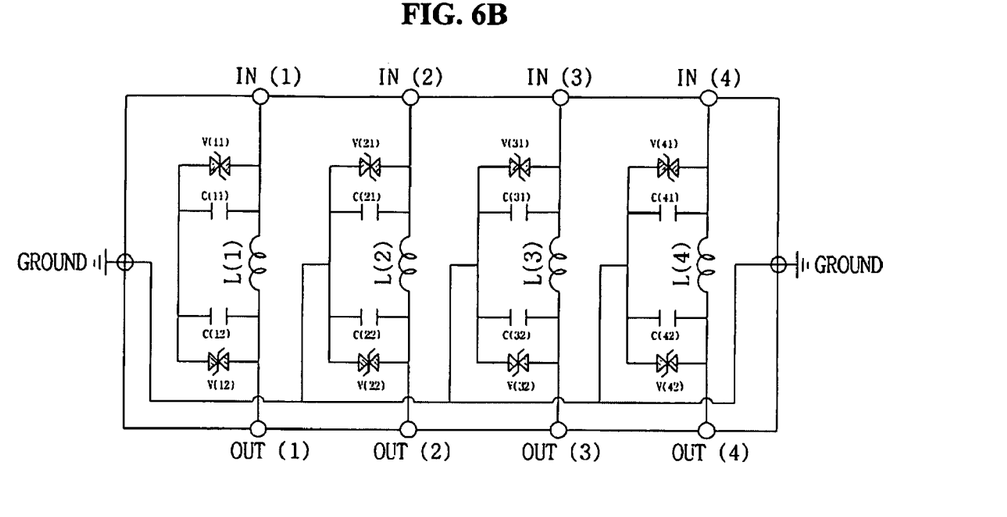
FIGS. 6B and 6C are equivalent circuit diagrams of the electronic device according to the third embodiment or the fourth embodiment.
Figure 6C:
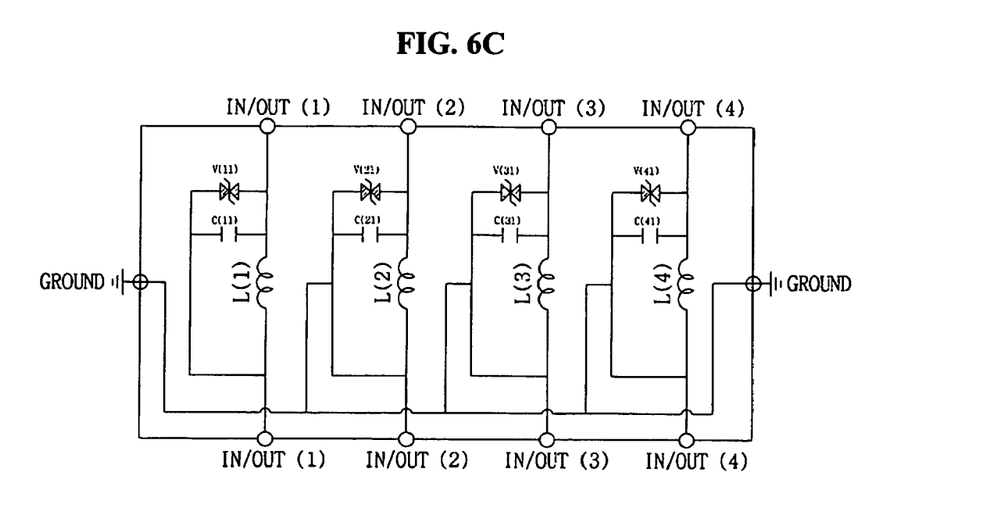

As illustrated in FIG. 6B, the electronic device of FIG. 6A may be equivalent to a circuit in which a plurality of L-C-V circuits are arranged in parallel, and in each L-C-V circuit, one varistor and one capacitor are positioned towards an input terminal at one side of one inductor and one varistor and one capacitor are positioned towards an output terminal at the other side of the inductor, and each varistor and each capacitor are grounded. Further, as illustrated in FIG. 6C, the electronic device may be equivalent to a circuit in which a plurality of L-C-V circuits are arranged in parallel, and in each L-C-V circuit, one varistor and one capacitor are positioned at one side of one inductor towards, for example, either an input terminal or an output terminal, and the varistor and the capacitor are grounded.

The composite electronic device according to the present invention can be manufactured as the composite component, by sheeting each raw material forming each of the first, second and third regions, performing a punching process about a desired part of a needed sheet, patterning the electrode material on the needed sheet, and layering the sheets.

Since the above-described manufacturing process is similar to a process of a general multilayered chip-type electronic device, there are the advantages of preventing an increase in the manufacturing cost due to the production of the composite component formed of different materials and enabling easy mass production.

The electronic device according to the present invention realizes the composite functions and provides the excellent mechanical characteristics and durability of the product. The primary reason for enabling the aforementioned excellent characteristics and durability is because the diffusion between the different materials forming the composite electronic device is basically prevented.

Figure 7A:
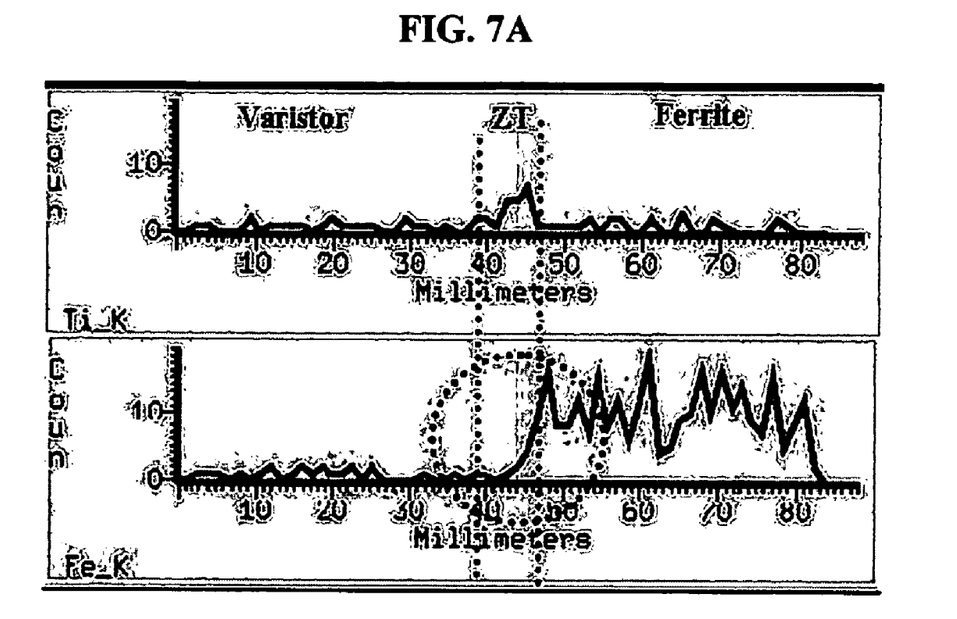
FIGS. 7A and 7B are graphs of diffusion preventing characteristics of the electronic device depending on whether a middle layer is present.

FIG. 7A is a graph showing a result of conducting an EDS (line-scan) analysis, to confirm whether or not the diffusion occurs between the different materials of the electronic device according to the present invention.

Figure 7B:
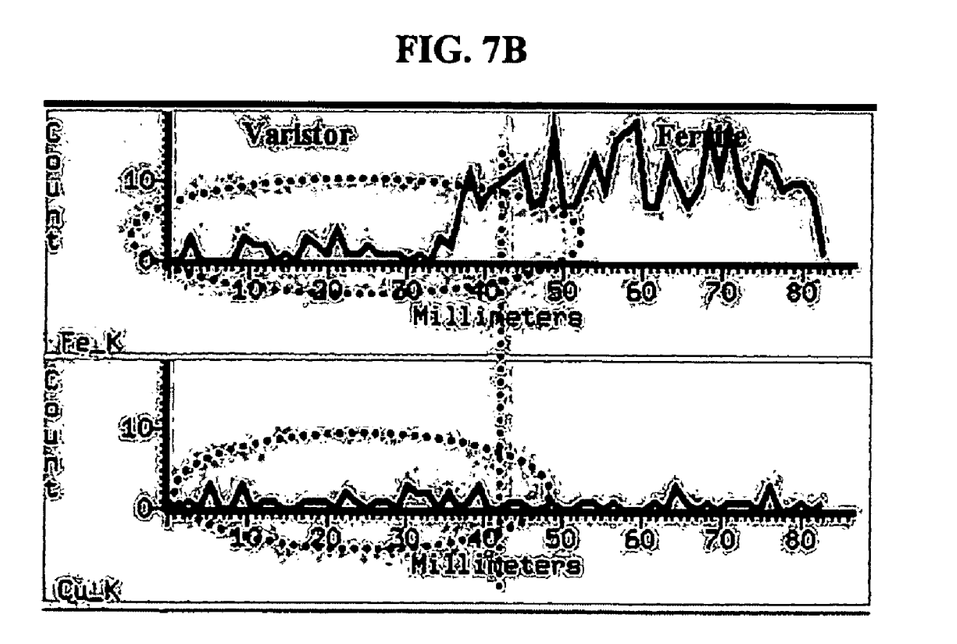

The main material of the dielectric material forming the varistor is ZnO and the main constituent material of ferrite used as the magnetic material is $Fe_2O_3$. It is noted that, due to the presence of the middle layer (ZT), the Fe ions of $Fe_2O_3$, the main constituent material which is likely to deteriorate the characteristics of the varistor, are prevented from diffusing to the varistor region. It is also noted that the distribution of the Fe ions between the varistor region and the ferrite region is clearly distinguished from each other. However, in FIG. 7B, as a result of joining the varistor region and the ferrite region without the middle layer, it is noted that the Fe ions considerably diffuse to the varistor region.

Figure 8A:
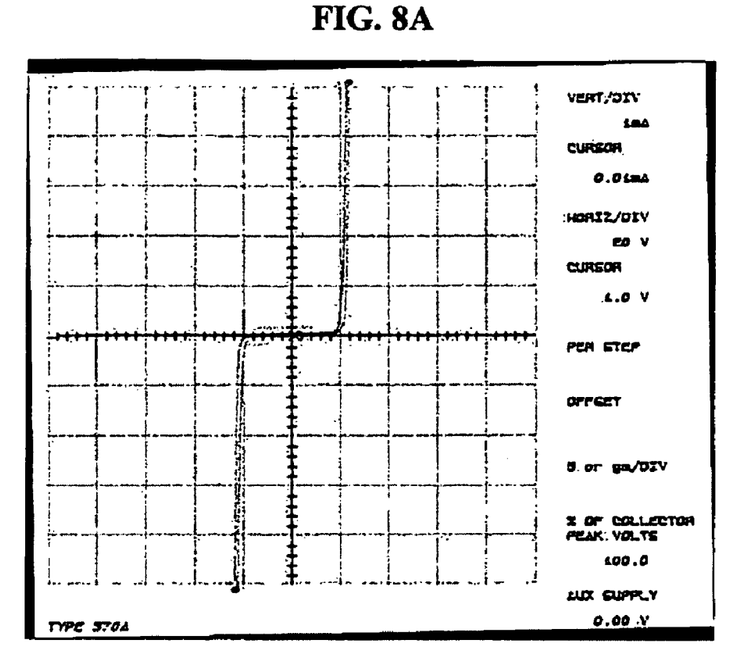
FIGS. 8A and 8B are graphs of current/voltage characteristics of the electronic device depending on whether a middle layer is present.

FIG. 8A illustrates a graph of current/voltage characteristics, to evaluate the characteristics of the varistor of the composite electronic device according to the present invention.

Figure 8B:
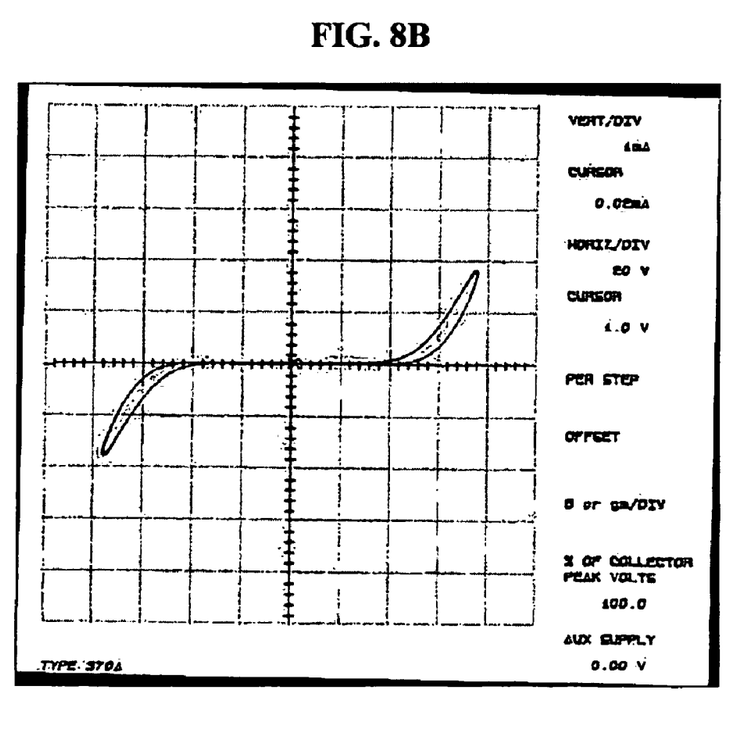

As a result of using the Zn—Ti-based material as the middle layer, even after the different materials of the magnetic material and the dielectric material are simultaneously sintered, an I/V curve shows a sharp change. From this, it is noted that the function of variable resistance of the varistor can be effectively performed. However, as illustrated in FIG. 8B, after the magnetic material and the dielectric material are simultaneously sintered without the middle layer of the Zn—Ti-based material, the I/V curve shows a gentle change. From this, it is noted that the function of the variable resistance cannot be effectively performed.

Figure 9:
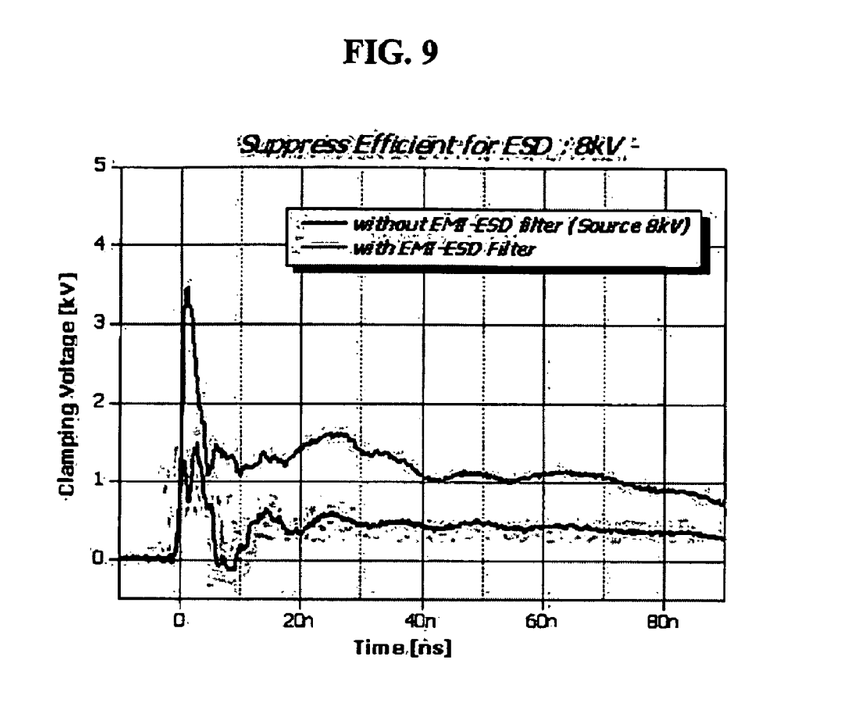
FIG. 9 is a graph of ESD controlling characteristics of the electronic device according to the present invention.

FIG. 9 is a graph showing a result of testing the function of controlling ESD among the characteristics of the varistor of the composite electronic device according to the present invention.

Specifically, the function of clamping the ESD is evaluated under the electrostatic discharge immunity test, level 4 (8 kV contact discharge) of Provision IEC-61000-4-2. The electronic device (indicated as a red line) according to the present invention sufficiently clamps the ESD source when 8 kV is applied, compared to an electronic device (indicated as a black line) without any ESD corresponding component. Accordingly, it is confirmed that, in the electronic device according to the present invention, the function of protecting the circuit is very excellent through the control of the ESD, which is the main function of the varistor.

Figure 10:
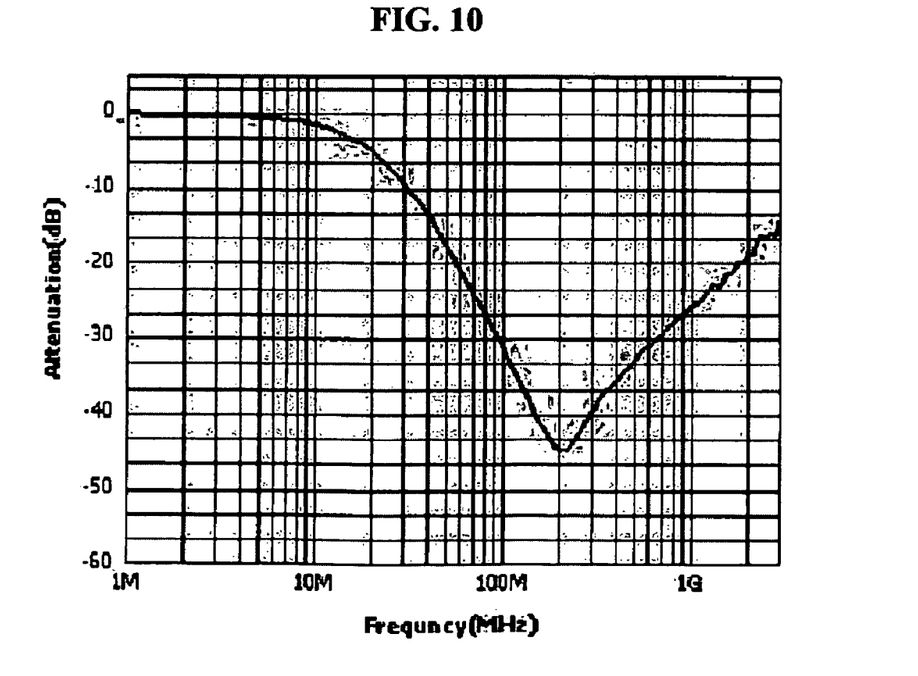
FIG. 10 is a graph of a filter characteristic of the electronic device according to the present invention.

FIG. 10 is a graph of characteristics of an EMI-ESD filter (varistor-noise filter) of the electronic device when the magnetic material and the dielectric material (varistor) are simultaneously sintered. As a result of examining the characteristics of reducing a noise by frequency bands, it is noted that CUT-off (−3 dB: the point at which the noise is reduced by about 50%) is formed in the region of 10~100 MHz. Further, it is noted that, a −20 dB point where the noise is reduced by about 99% also starts at a low frequency band. Thus, the noise can be removed in the broader frequency range, starting from the low frequency band.

The composite component realizes high inductance inductor by forming the inductor in the magnetic material region (the first region), thereby making it possible to realize the CUT-off point in the low frequency band. However, since the CUT-off point cannot be located at or under 100 MHz by low inductance (inductance of several nH) formed using the dielectric material, there is a limitation in that noise is selectively removed only in the range of high frequency band.

The invention has been described using preferred exemplary embodiments. However, it is to be understood that the scope of the invention is not limited to the disclosed embodiments. On the contrary, the scope of the invention is intended to include various modifications and alternative arrangements within the capabilities of persons skilled in the art using presently known or future technologies and equivalents. The scope of the claims, therefore, should be accorded the broadest interpretation so as to encompass all such modifications and similar arrangements.

The invention claimed is:

1. A magnetic and dielectric composite electronic device, comprising:
    a first region with a plurality of magnetic material sheets being layered;
    a second region with a plurality of dielectric material sheets being layered; and
    a third region as a middle layer interposed between the first region and the second region, including a Zn—Ti-based material to prevent diffusion of the materials during co-firing of the first region and the second region, wherein the first region, the second region and the third region are integrally formed in a single body, and the third region is formed of powder including ZnO of 0.5~1.0 mol and $TiO_2$ of 0.5~1.0 mol.

2. The composite electronic device of claim 1, wherein the third region is formed of a single sheet or a composite sheet with a plurality of sheets being layered.

3. The composite electronic device of claim 1, wherein the third region further comprises $Bi_2O_3$ of 0.1~0.35 mol.

4. The composite electronic device of claim 1, wherein the third region further comprises NiO being or less than 0.1 mol.

5. The composite electronic device of claim 1, wherein the third region further comprises $MnCO_3$ being or less than 0.1 mol.

6. The composite electronic device of claim 1, wherein a pair of ground electrodes and a pair of signal electrodes are formed on an outer surface of the device.

7. The composite electronic device of claim 1, wherein a pair of ground electrodes and a plurality of signal electrodes are formed on an outer surface of the device.

8. The composite electronic device of claim 1, wherein the first region comprises one electrode pattern formed on the magnetic material sheet.

9. The composite electronic device of claim 8, wherein a via-hole is formed at one end of the electrode pattern.

10. The composite electronic device of claim 8, wherein the second region comprises at least two sheets, each sheet on which the electrode pattern is extended to only one side end of the dielectric material sheet; and a sheet on which the electrode pattern is extended to two side ends of the dielectric material sheet.

11. The composite electronic device of claim 8, wherein the device is represented by an equivalent circuit in which a varistor and a capacitor are positioned towards an input terminal of the device at one side of one inductor, and another varistor and another capacitor are positioned towards an output terminal of the device at the other side of the inductor, each varistor and each capacitor being grounded.

12. The composite electronic device of claim 8, wherein the device is represented by an equivalent circuit in which one varistor and one capacitor are positioned at one side of one inductor towards either an input terminal or an output terminal of the device, the varistor and the capacitor being grounded.

13. The composite electronic device of claim 1, wherein the first region comprises a plurality of electrode patterns formed to be independently from one another on the magnetic material sheet.

14. The composite electronic device of claim 13, wherein a via-hole is formed at one end of each of the plurality of electrode patterns.

15. The composite electronic device of claim 13, wherein the second region comprises at least two sheets, each sheet on which the plurality of electrode patterns are respectively extended to only one side end of the dielectric material sheet; and a sheet on which the plurality of electrode patterns are respectively extended to two side ends of the dielectric material sheet.

16. The composite electronic device of claim 13, wherein the device is represented by an equivalent circuit in which a plurality of L-C-V circuits are arranged in parallel, and in each L-C-V circuit, a varistor and a capacitor are positioned towards an input terminal of the device at one side of one inductor, and another varistor and another capacitor are positioned towards an output terminal of the device at the other side of the inductor, each varistor and each capacitor being grounded.

17. The composite electronic device of claim 13, wherein the device is represented by an equivalent circuit in which a plurality of L-C-V circuits are arranged in parallel, and in each L-C-V circuit, one varistor and one capacitor are positioned at one side of one inductor towards either an input terminal or an output terminal of the device, the varistor and the capacitor being grounded.

18. The composite electronic device of claim 1, wherein the Zn—Ti-based material of the third region is formed on the whole sheet.

19. The composite electronic device of claim 1, wherein the Zn—Ti-based material of the third region is locally formed on the sheet.

* * * * *